US006524114B2

(12) United States Patent
Watanabe et al.

(10) Patent No.: US 6,524,114 B2
(45) Date of Patent: Feb. 25, 2003

(54) BOARD CONNECTING TERMINAL AND CONNECTOR USING THE TERMINAL

(75) Inventors: Hiroshi Watanabe, Shizuoka (JP); Mitsunobu Kato, Shizuoka (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 09/947,539

(22) Filed: Sep. 7, 2001

(65) Prior Publication Data

US 2002/0028588 A1 Mar. 7, 2002

(30) Foreign Application Priority Data

Sep. 7, 2000 (JP) ....................................... 2000-271370

(51) Int. Cl.$^{7}$ ........................... H01R 12/00; H05K 1/00
(52) U.S. Cl. ............................ 439/65; 439/260; 439/62
(58) Field of Search ................................ 439/260, 635, 439/267, 62, 636, 637, 65

(56) References Cited

U.S. PATENT DOCUMENTS 3,614,707 A * 10/1971 Kaufmann .................. 439/260
3,922,054 A * 11/1975 Dechelette .................. 439/260
4,295,700 A * 10/1981 Sado ........................... 439/65
4,327,955 A * 5/1982 Minter ....................... 439/260
5,496,182 A * 3/1996 Yasumura .................... 439/62
6,004,140 A * 12/1999 Kato et al. ..................... 439/65

FOREIGN PATENT DOCUMENTS

JP 10-302909 11/1998

* cited by examiner

*Primary Examiner*—Javaid Nasri
(74) *Attorney, Agent, or Firm*—Armstrong, Westerman & Hattori, LLP

(57) ABSTRACT

A board connecting terminal and a connector using the terminal are provided, wherein a contact pressure of the terminal connecting circuit boards arranged orthogonally is secured. The board connecting terminal has a first elastic contact portion projecting arcuately or mountain-shapedly on one side, a second elastic contact portion curvingly inclined extending in substantially the same direction as the extending direction of the first elastic contact portion, and a middle baseplate portion curved or straight and connecting both the elastic contact portions. In a connector, one circuit board is put into contact with the first elastic contact portion, and the other circuit board is put into contact with the second elastic contact portion. A supporting portion for the middle baseplate portion is provided in a connector housings accommodating at least the first elastic contact portion of the board connecting terminal. An end portion of the first elastic contact portion abuts, or is secured to the connector housing, and the board connecting terminal is slidably supported in a longitudinal direction by the supporting portion.

20 Claims, 9 Drawing Sheets

BOARD CONNECTING TERMINAL AND CONNECTOR USING THE TERMINAL

BACKGROUND OF THE INVENTION

1. Field of the Invention

The present invention relates to a board connecting terminal and a connector using the same, which connector connects circuit boards orthogonally arranged, for example, in a motor vehicle.

2. Description of the Related Art

FIG. 18 shows a prior art connector disclosed in Japanese Patent Application Laid-open No. 10-302909. This connector consists of a female connector 122 openable-and-closable about a hinge 121 as a fulcrum and a male connector 123 inserted the female connector 122.

The female connector 122 consists of an upper and lower pair of housings 124 of synthetic resin and terminals 125 accommodated in each housing 124. The terminal 125 has an elastically contacting piece 125 on one side and an electric wire crimping portion (not shown) on the other side. The elastically contacting piece 125 projects from a rectangular opening 126 of the housing 124, and the electric wire crimping portion is crimped to an electric wire 127.

The male connector 123 consists of a housing 128 of synthetic resin and terminals 129 accommodated in the housing 128 in upper and lower layers. The terminal 129 has a tabular electrically contacting portion 129 and an electric wire crimping portion (not shown), and the electrically contacting portion 129 projects from an opening 130 each provided on both front and back sides of the housing 128.

The male housing 128 has tapered pushing portions 131 on the front end. The female housing 124 has, on the hinge side, tapered pushed portions 132 for the respective pushing portions 131.

On inserting the male connector 123 into the female connector 122 the tapered pushing portion 131 abuts the pushed portion 132, while closing the upper and lower housings 124. By this, the upper and lower elastically contacting pieces 125 are put into contact with the electrically contacting portions 129 elastically, and the electric wires 127,133 are mutually connected.

With respect to the above prior art connector 122, however, because the electric wire 127, as a circuit conductor, has to be connected to the terminal 125 by means of the crimping, the pressure welding, or the welding, many man-hours are required. Therefore, this connector has no degree of freedom of attaching or detaching the electric wire 127 to/from the terminal 125. The circuit (the terminal) 129 is connected to the connector 122 only in parallel (horizontal).

When both ends of the elastically contacting piece of the terminal 125 of the connector 122 are fixed in the opening 126 of the housing 124, the spring modulus of the elastically contacting piece becomes larger. Therefore, when a necessary displacement of the elastically contacting piece is not secured because of, for example, a dimension error of the terminal 125, a necessary contact pressure would not be obtained. When a projection of the elastically contacting piece is small because of a dimension error, the contact pressure for the mating terminal (the circuit conductor) 129 becomes small, thereby lowering reliability of the electrical connection.

SUMMARY OF THE INVENTION

In view of the foregoing, an object of the present invention is to provide a board connecting terminal and a connector using the terminal, which connector can be applied to circuit boards arranged in a crossing direction or an orthogonal direction to each other, can reduce time for the connection with the circuit conductors, can enhance the degree of freedom of attaching to or detaching from the circuit conductors, can easily secure a necessary contact pressure to the circuit conductors, and can securely connect both the circuit boards with an appropriate contact pressure.

In order to achieve the above object, as a first aspect of the present invention, a board connecting terminal comprises: a first elastic contact portion projecting arcuately or mountain-shapedly; a second elastic contact portion curved or inclined and extending in substantially the same direction as a projecting direction of the first elastic contact portion; and a middle baseplate portion being curved or straight and connecting the first elastic contact portion and the second elastic contact portion.

As a second aspect of the present invention, based on the first aspect, a short straight portion is formed at a free end of the first elastic contact portion.

As a third aspect of the present invention, based on the first aspect, in place of the second elastic contact portion, another elastic contact portion in substantially the same shape as the first elastic contact portion and is formed axial-symmetrically with the first elastic contact portion.

As a fourth aspect of the present invention, a connector, using the board connecting terminal having any one of the first to third aspects, to put the first elastic contact portion into contact with a first circuit board and put the second elastic contact portion into contact with a second circuit board comprises: a connector housing accommodating at least the first elastic contact portion of the board connecting terminal; and a supporting portion provided on the connector housing so as to slidably support the middle baseplate portion, wherein the free end of the first elastic contact portion abuts, or is fixed to the connector housing, and the board connecting terminal is longitudinally slidably supported by the supporting portion.

As a fifth aspect of the present invention, based on the fourth aspect with the board connecting terminal of the third aspect, a free end of the second elastic contact portion is slidably supported by the connector housing.

As a sixth aspect of the present invention, based on the fourth aspect, a stopping portion to abut the supporting portion is formed between the middle baseplate portion and the second elastic contact portion.

As a seventh aspect of the present invention, based on the fourth aspect, the connector housing consists of a pair of housings openable-and-closable through a hinge, and the first circuit board is inserted between the housings.

As an eighth aspect of the present invention, based on the fourth aspect, the connector housing has a board insertion hole in which the first elastic contact portion projects and an opening from which the second elastic contact portion projects.

As a ninth aspect of the present invention, based on the fourth aspect, the connector housing is provided with an engaging means to engage the second circuit board.

As a tenth aspect of the present invention, based on any one of the fourth to ninth aspects, at least two kinds of board connecting terminals having different respective lengths are provided, and the board connecting terminal having a longer length is put into contact with a third circuit board arranged behind the second circuit board.

According to the above-described structures of the present invention, the following advantages are provided.

(1) Because the first elastic contact portion is put into contact with one circuit board and the second elastic contact portion is put into contact with the other circuit board, both the crossed or orthogonal circuit boards can be securely and easily connected to each other with low cost. That is, because the crimping work of an electric wire and a terminal is unnecessary, connection time for the terminal and the circuit conductor of the circuit board is reduced, the degree of freedom of attaching/detaching the terminal to/from the circuit conductor, and assemblage and maintaining are made easier.

Because the second elastic contact portion extends in substantially the same direction the projecting direction of the first elastic contact portion, the first and second elastic contact portions are bent stably when the first elastic contact portion is pressed on one circuit board and the second elastic contact portion is pressed on the other circuit board. And, because the contact pressures of both the elastic contact portions against the circuit boards are smoothly balanced (equalized) through the middle baseplate portions, the elastic contact portions are put into contact with the respective circuit boards with equal and appropriate contact pressures, thereby improving reliability of the electrical connection.

(2) Because the straight portion on the free end of the first elastic contact portion abuts the connector housing and is secured, the terminal extends in a direction opposite to the free end, i.e. toward the second elastic contact portion, when the first elastic contact portion is pressed on one circuit board and bent. And, when the second elastic contact portion is pressed on the other circuit board and bent, the first elastic contact portion can securely receive the bending reaction force. Therefore, the contact pressures of the elastic contact portions are smoothly and securely adjusted.

(3) Because the first elastic contact portion and the second elastic contact portion are similarly shaped, the contact pressures of the elastic contact portions are easily equalized and accurately balanced, thereby further improving reliability of the electrical connection. And, because both the elastic contact portions are axial-symmetrically formed, the crossed or orthogonal circuit boards can be easily connected.

(4) Because the first elastic contact portion is put into contact with one circuit board and the second elastic contact portion is put into contact with the other circuit board, both the crossed or orthogonal circuit boards can be securely and easily connected each other with low cost. That is, because the crimping work of an electric wire and a terminal is unnecessary, connection time for the terminal and the circuit conductor of the circuit board is reduced, the degree of freedom of attaching/detaching the terminal to/from the circuit conductor, and assemblage and maintenancability are improved.

And, when the first elastic contact portion is pressed on one circuit board and the second elastic contact portion is pressed on the other circuit board, an unbalance of the contact pressures can be corrected by a movement of the terminal along the supporting portion, thereby improving reliability of the electrical connection.

(5) Because the free end on a side of the second elastic contact portion formed similarly to the first elastic contact portion is slidably supported by the connector housing, the second elastic contact portion bends around the free end as a fulcrum and smoothly moves (slides) along the supporting portion of the connector housing when the second elastic contact portion is pressed on the other circuit board. Therefore, when the contact pressures of the first elastic contact portion is small, the contact pressure of the first elastic contact portion is further securely revised.

(6) When the second elastic contact portion is put into initial contact with the other circuit board, the stopping portion of the terminal abuts the supporting portion of the connector housing and therefore the terminal does not move toward the first elastic contact portion. Therefore, because an insertion gap for one circuit board is secured on the side of the first elastic contact portion, the one circuit board can be smoothly inserted with a small force, thereby improving connecting workability of the circuit board.

(7) When the other circuit board is inserted between the pair of housings, both the housings are closed, the terminal turns in the closing direction integrally with the housing, and the second elastic contact portion is pressed on the other circuit board. Therefore, the contact between both the elastic contact portions and both the respective circuit boards is carried out simultaneously, thereby improving equalization of the contact pressures of the elastic contact portions.

(8) When one circuit board is inserted into the board insertion hole, the first elastic contact portion is put into contact with one circuit board elastically and the second elastic contact portion is put into contact with the other circuit board elastically from the opening. Therefore, the crossed or orthogonal circuit boards are securely and easily connected through both the elastic contact portions.

(9) Because the second elastic contact portion is put into contact with or is in a state near a contact with the other circuit board by engaging the connector housing with the other circuit board, the one circuit board can be easily inserted toward the first elastic contact portion.

(10) Because a power terminal and a signal terminal can be easily formed by at least changing the length of the middle baseplate portion, the cost for the terminal can be reduced.

The above and other objects and features of the present invention will become more apparent from the following description taken in conjunction with the accompanying drawings.

DESCRIPTION OF THE PREFERRED EMBODIMENT(S)

Embodiments of the present invention will now be described in further detail with reference to the accompanying drawings. FIGS. 1–5 show a first embodiment of a board connecting terminal and a connector using the terminal in accordance with the present invention.

Figure 1:
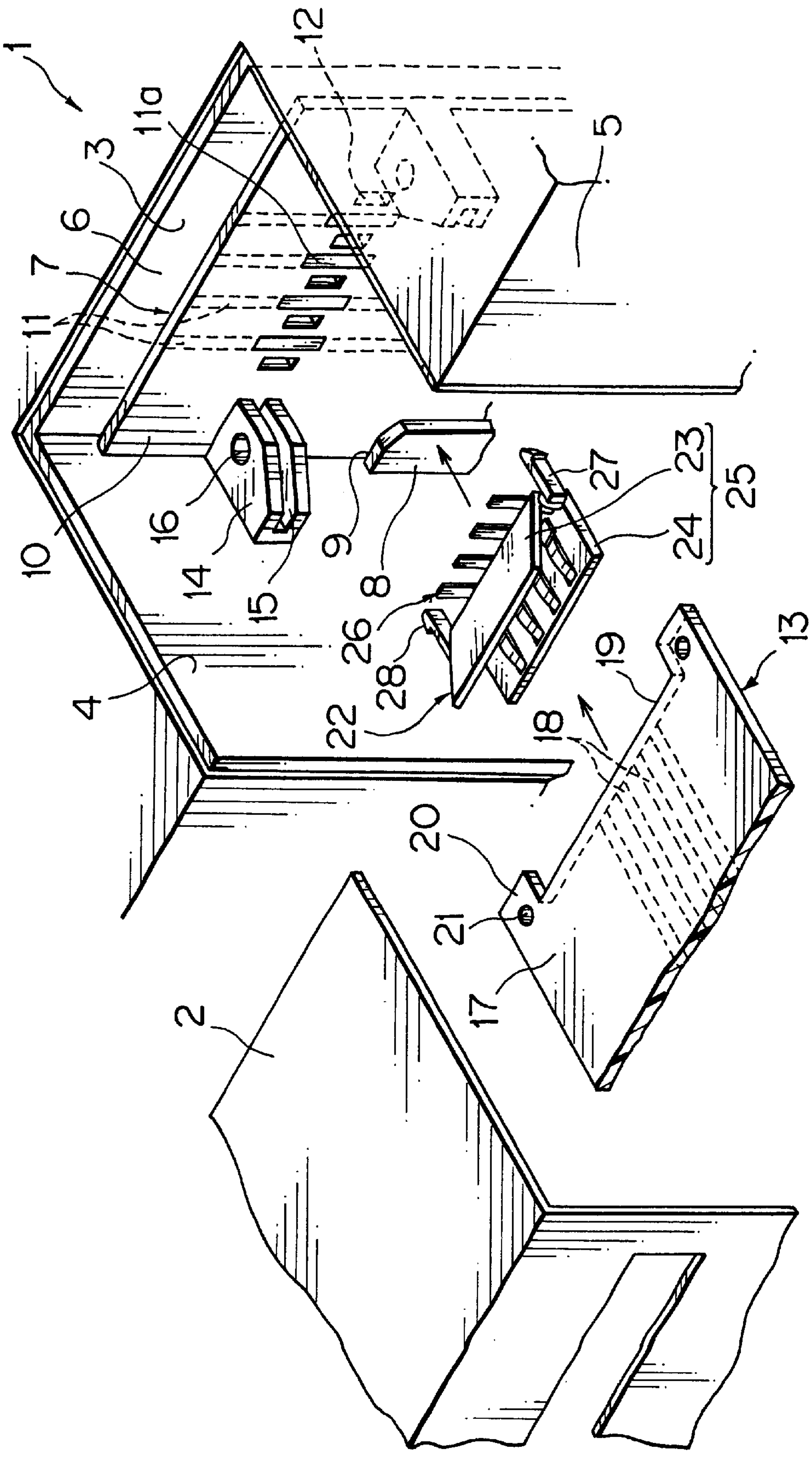
FIG. 1 is an exploded perspective view showing a first embodiment of a terminal and a connector using the terminal in accordance with the present invention and an application thereof.

FIG. 1 is an exploded perspective view showing a connection structure using connector 22. The connector 22 is applied to the connection of circuit assemblies (i.e. circuit boards) and accessories of a motor vehicle. In FIG. 1, 1 designates a casing as an instrument panel core, 2 designates a cover as a cluster.

The casing 1 has a vertical rear wall 3, sidewalls 4, and flange walls 5, and a space 6 is provided among them. A first (or second) circuit board 7 is vertically accommodated in the space 6. A first guide portion 8 is vertically provided on each of the sidewalls 4, and the first circuit board 7 slidably engages guide grooves 9 behind the respective first guide portions 8. In this embodiment, a cover 2 side, i.e. driver's side, is defined as a front side of the casing 1.

The first circuit board 7 is a circuit assembly on a side of the instrument panel and has flat circuit conductors 11 of, for example, a power circuit and/or a signal circuit in parallel with uniform intervals on the face of an insulated board 10 made of synthetic resin. Each flat circuit conductor 11 has an exposed portion (an exposed conductor) 11 a exposed from the insulating cover of the insulated board 10. Rectangular engaging holes (engaging portions) 12 to engage a connector 22 to the insulated board 10 are arranged in parallel.

A second guide portion 14 is horizontally provided on each side of the insulated board 10 for guiding a second (or first) circuit board 13 for an accessory. The second guide portion 14 has a horizontal guide groove 15 and a vertical hole portion 16 for fixing the circuit board.

The second circuit board 13 is a printed circuit board and is connected to a non-shown accessory arranged inside the cover 2. The second circuit board 13 has a plurality of parallel circuit conductors (printed circuits) 18 on the back of an insulated board 17 made of synthetic resin. The circuit conductors 18 are exposed at their ends. The second circuit board 13 has a recess 19 at the end and projecting portions 20 at both sides of the recess 19. Projecting portions 20 each have a hole portion 21 relative to the hole portion 16 of the second guide portion 14. The second circuit board 13 is fixed to the second guide portions 14 by a non-shown fixing means such as bolts and nuts or fixing clips.

The connector 22 is connected to the end of the second circuit board 13. The connector 22 has upper and lower housings 23,24, made of synthetic resin and pivotable to each other, and generally L-shaped board connecting terminals 26 whose rear half portions are accommodated in the lower housing 24 and whose front half portions project toward the first circuit board. The housing 23,24 constitutes a connector housing 25. Here, a first circuit board 7 side of the connector 22 is defined as its front.

A pair of engaging arms (engaging members) 27 made of synthetic resin are pivotably provided on the respective sides of the lower housing 24 toward the first circuit board 7. Each engaging arm 27 has an outwardly-facing claw-like engaging projection 28 at the front end. The engaging projection 28 engages the engaging hole 12 of the first circuit board 7. The engaging arms 27 are positioned at the vertical center of the upper and lower housings 23,24.

A vertical length of the engaging holes 12 is larger to some extent than a vertical width of the engaging projections 28 (i.e. the engaging arms 27) so as to absorb a vertical position divergence of the connector 22. The length of the exposed conductor 11*a* of the first circuit board 7 is a little longer than the length of the engaging holes 12. In this embodiment, since a plurality of engaging holes 12 are provided on the first circuit board 7, an attaching place of the connector 22 can be changed according to the circuit conductors 11.

Figure 2:
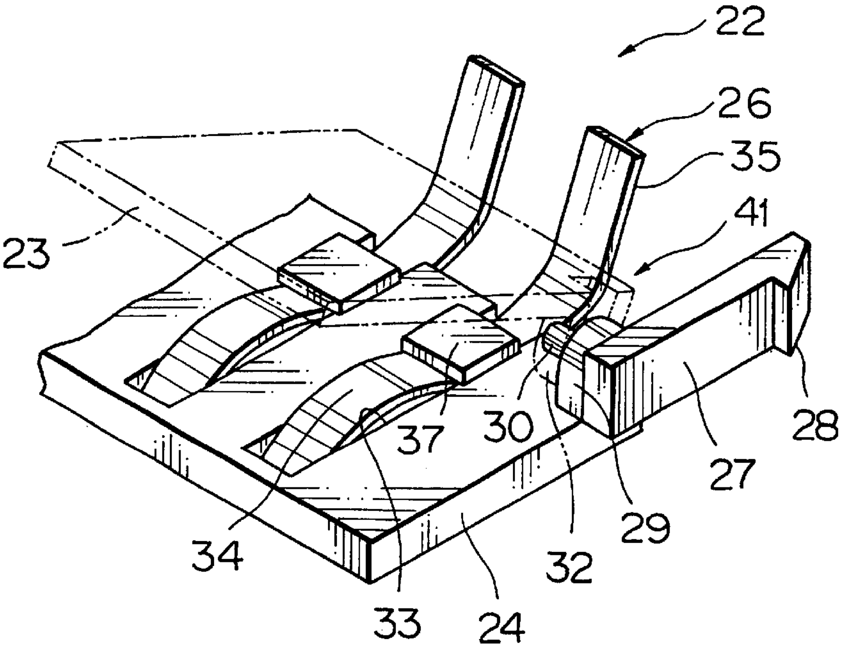
FIG. 2 is a perspective view showing a main portion of the connector.

FIG. 2 shows a first embodiment of the connector in accordance with the present invention. In FIG. 2, a bearing 29 of a semicircle tabular shape is provided upward on both sides of the front end portion of the lower housing 24. A short cylindrical shaft portion 30 provided inwardly at the proximal end of each engaging arm 27 is put through each bearing 29. A bearing 32 provided on both sides of the front end of the upper housing 23 also engages the shaft portion 30.

The engaging arm 27 has a lateral resilience so that the engaging arm 27 can bend inward while a slant plane of the engaging projection 28 slides on the edge of the engaging hole 12 of the first circuit board 7 (FIG. 1). On the completion of the slide of the engaging arm 27 against the edge of the engaging hole 12 the engaging arm 27 flexes outward, and an engaging plane of the engaging projection 28 engages the back of the first circuit board 7. The engaging arm 27 projects toward the first circuit board 7 a little further than the terminal 26.

A plurality of terminal accommodating grooves 33 are formed in the lower housing 24 in parallel. The depth of each terminal accommodating groove 33 is almost the same as or a little larger than the plate thickness of the terminal 26. The front and rear sides of a rear elastic contact portion (a first elastic contact portion) 34 of the generally L-shaped terminal 26 are held by the terminal accommodating groove 33. And, a front elastic contact portion (a second elastic contact portion) 35 of the terminal 26 curvedly or inclinedly projects upward from the terminal accommodating groove 33.

Figure 3:
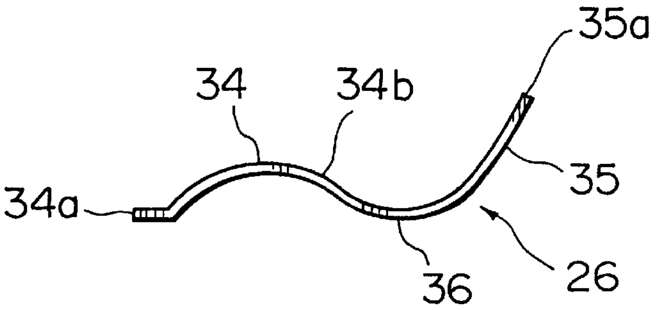
FIG. 3 is a side view showing the terminal.

As shown in FIG. 3, the rear elastic contact portion 34 curves arcuately upward. The rear portion (a straight portion or an end portion 34*a*) of the elastic contact portion 34 is formed straight for a short distance, and the front side of the elastic contact portion 34 continues to the front elastic contact portion 35 which is raised obliquely upward through the middle baseplate portion 36 which is slightly curved downward. The front elastic contact portion 35 extends obliquely upward toward the first circuit board 7 (FIG. 1), while having an upper free end 35*a*. The rear elastic contact portion 34 and the front elastic contact portion 35 are substantially the same shape. The front elastic contact portion 35 projects in a direction almost perpendicular to a curved front half portion 34*b* of the rear elastic contact portion 34.

As described, the terminal 26, in a free state, consists of the rear elastic contact portion 34 curved arcuately upward, the rear-end-side short straight portion 34*a* of the elastic contact portion 34, i.e., a fixing portion or an abutting portion against the housing 24, the middle baseplate portion 36 continuing from the elastic contact portion 34 arcuately downward in front thereof to exhibit the elasticity of the front elastic contact portion 35, and the front elastic contact portion 35 continuing straight or curved slightly from the middle baseplate portion 36 obliquely upward.

An S-shaped bent portion is formed of two curved elastic contact portions 34, 35. The middle baseplate portion 36 is not necessarily curved; that is, the portion may be straight if the elasticity of the front elastic contact portion 35 is secured. The terminal 26 is made with one piece of conductive metal.

The rear elastic contact portion 34 is put into contact with an exposed conductor (not shown) of the second circuit board 13 (FIG. 1) elastically, and the front elastic contact portion 35 is put into contact with the exposed conductor 11*a* of the first circuit board 7 (FIG. 1) elastically. A downward curved portion (a middle baseplate portion) 36 between the elastic contact portions 34,35 is slidably supported by a supporting wall (a supporting portion) 37 integrally formed with the housing 24 (FIG. 2) at the front end thereof.

The rear end side of the rear elastic contact portion 34 is formed into a short straight portion in a horizontal direction, this straight portion 34*a* abuts the rear end of the terminal accommodating groove 33 (FIG. 2) of the housing 24 to check a backward movement of the terminal 26. A groove or a hole (not shown) to receive the rear end portion 34*a* of the terminal 26 may be provided at the rear end of the terminal accommodating groove 33.

In a state of the terminal 26 being mounted on the lower housing 24 or before mounting it, as shown in FIG. 2, the upper housing 23 can be easily assembled to the lower housing 24 by means of the shaft portion 30. The bearings 32 are put into contact with respective inner surfaces of the bearings 29 of the lower housing 24. A hinge 41 is made up of the shaft portion 30 and the bearings 29,32. The upper housing 23 has almost the same thickness, length, and width as those of the lower housing 24.

Figure 4:
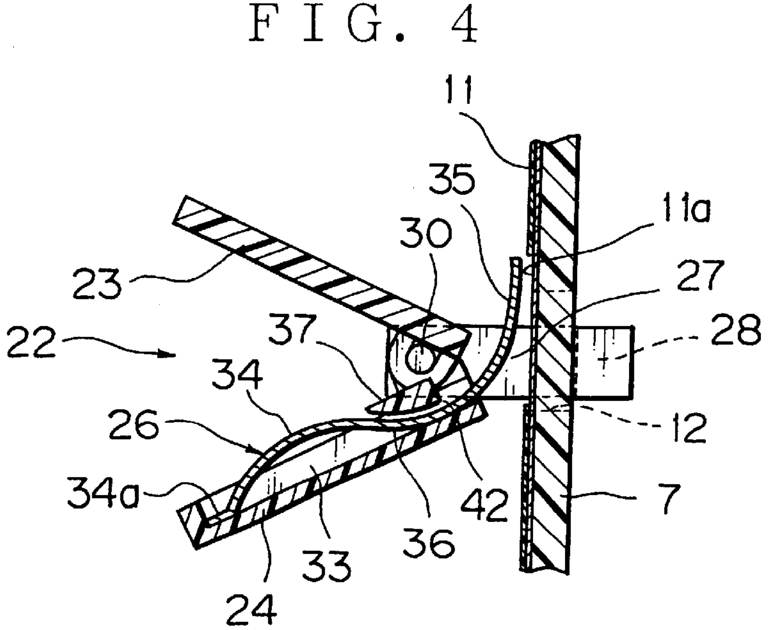
FIG. 4 is a longitudinal sectional view showing a state of the connector engaging a vertical circuit board.
Figure 5:
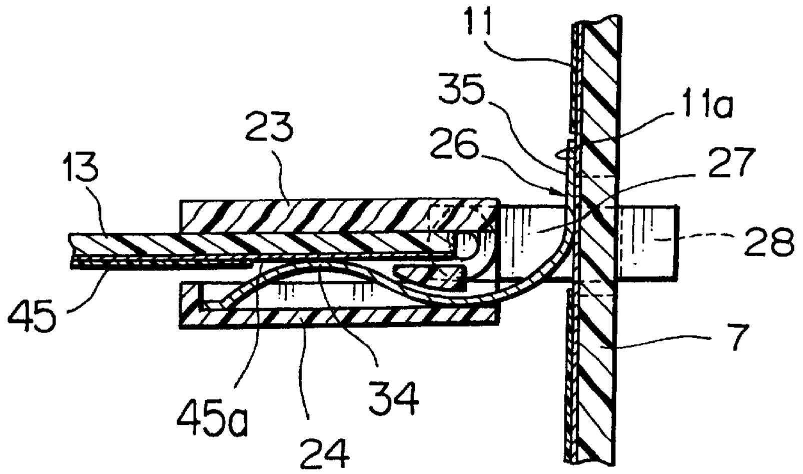
FIG. 5 is a longitudinal sectional view showing a state that a horizontal circuit board is connected to the vertical circuit board through the connector.

FIG. 4 is a longitudinal sectional view showing a state of the connector 22 engaging a first circuit board 7, and FIG. 5 is a longitudinal sectional view showing a state that a second circuit board 13 is connected to the first circuit board 7 through the connector 22.

As shown in FIG. 4, a gap 42 with a thickness not less than that of the terminal 26 is formed between a bottom surface of the terminal accommodating groove 33 and the lower surface of the supporting wall 37 of the housing 24. The terminal 26 is bendable or longitudinally slidable in the gap 42. An inside surface of the supporting wall 37 is preferably curved along the curved middle baseplate portion 36 of the terminal 26. And, by inserting the rear elastic contact portion 34 into the gap 42, the terminal 26 can be easily assembled to the lower housing 24. The rear straight portion 34*a* of the rear elastic contact portion 34 abuts a rear end of the terminal accommodating groove 33. The rear straight portion 34*a* may engage a hole or groove (not shown) of the housing 24.

The claw portion 28 of the engaging arm 27 is engaged to the engaging hole 12 of the first circuit board 7, whereby the connector 22 is fixed to the first circuit board 7. The housings 23,24 open in relation to each other to some extent by means of an elastic member (not shown) such as a spring piece provided on the lower housing 24. In this opened state of the housings 23,24, the front elastic contact portion 35 of the terminal 26 faces the circuit conductor 11 of the first circuit board 7.

As shown in FIG. 5, when both the housings 23,24 are closed, the terminal 26 turns toward the first circuit board 7 and is put into contact with the exposed conductor 11*a* elastically, while the second circuit board 13 is put into the housing 23,24 horizontally. In this state, the rear elastic contact portion 34 of the terminal 26 located between the housings 23,24 are in elastic contact with an exposed conductor 45*a* of circuit conductor 45 of the second circuit board 13. The upper housing 23 presses the second circuit board 13. In this way, the circuit boards 7,13 are electrically connected, and the power circuit and/or the signal circuit are connected between the instrument panel and the accessory. The housing 23,24 are kept in a closed state by a non-shown engaging means.

Figure 18:
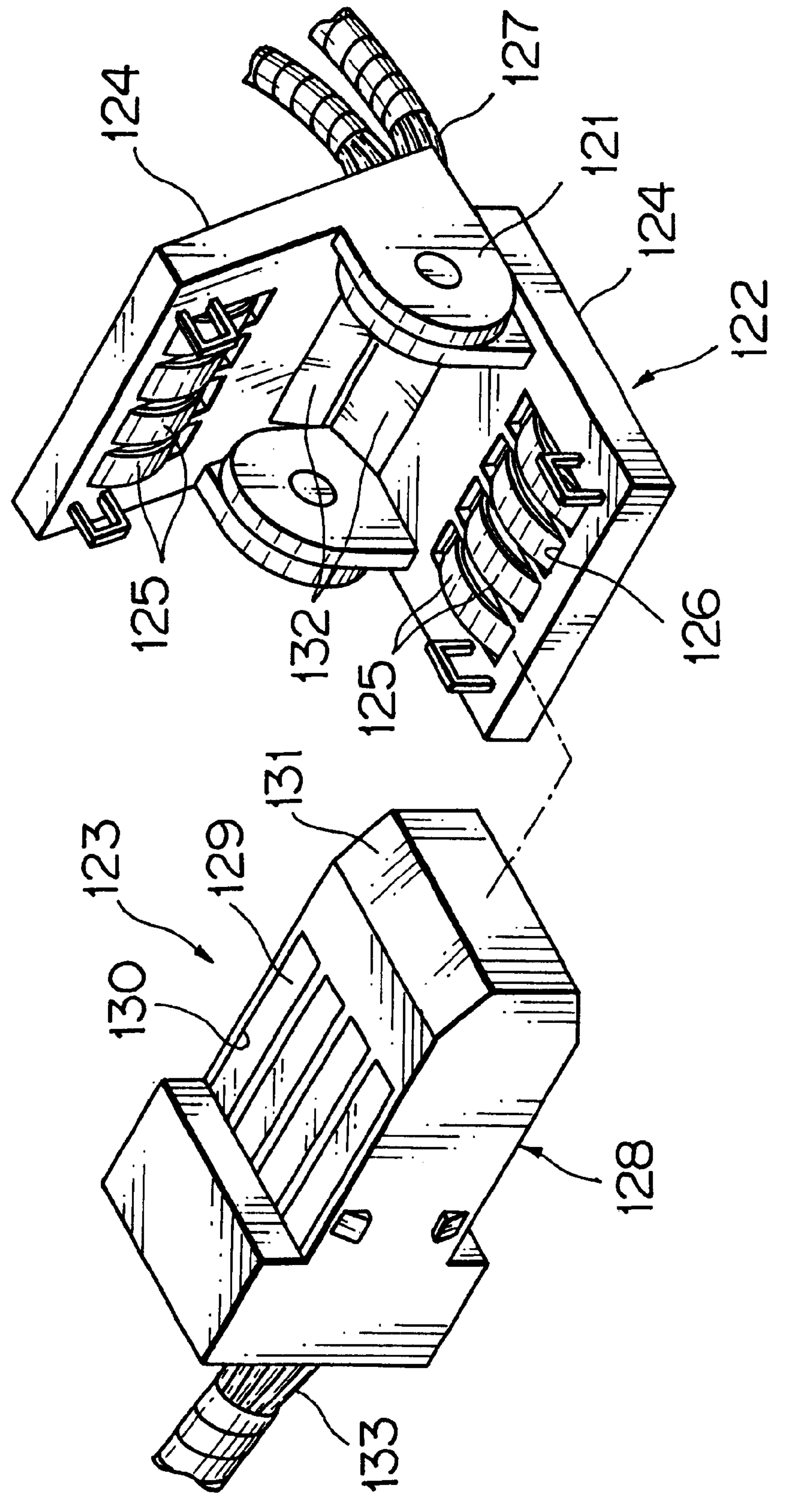
FIG. 18 PRIOR ART
FIG. 18 is an exploded perspective view showing a connector using a prior art terminal.

A sloping portion (not shown) may be formed inside the front end of each of the housings 23,24 for facilitating the closing operation of the housings 23,24 in a manner similar to the prior art (FIG. 18). The housings 23,24 can be closed by pushing the sloping portions by the comers of an end of the second circuit board 13. Here, when the second circuit board 13 is inserted between the housings 23,24, the elastic member (spring piece), to support the housings 23,24 in an opened state, is pushed by the end of circuit board 13.

With this structure, when the connection state of the connector 22 of FIG. 5 is obtained from the non-connection state of FIG. 4, that is, when the front elastic contact portion 35 of the terminal 26 is pressed against the vertical first circuit board 7, the rear elastic contact portion 34 is put into contact with the horizontal second circuit board 13 strongly. Simultaneously, the rear elastic contact portion 34 is bent and the front elastic contact portion 35 is put into contact with the first circuit board 7 strongly. By such action, the contact pressure of the elastic contact portions 34,35 against the circuit boards 13,7 balances, thereby improving reliability of the electrical connection.

As another advantage, the accessories and circuits on the vehicle body side (the first circuit board 7) can be easily and securely connected without using an electric wire such as a wiring harness. Because the electric wire is not used, the structure is simplified and the connection time can be reduced. And, because the engaging arms 27 of the connector 22 are pivotable, even if the connector 22 is not perpendicular relative to the first circuit board 7, the engaging arms 27 securely engage the respective fitting holes 12, and the contact between the terminals 26 and the exposed conductors 11*a* can be securely carried out.

Figure 6:
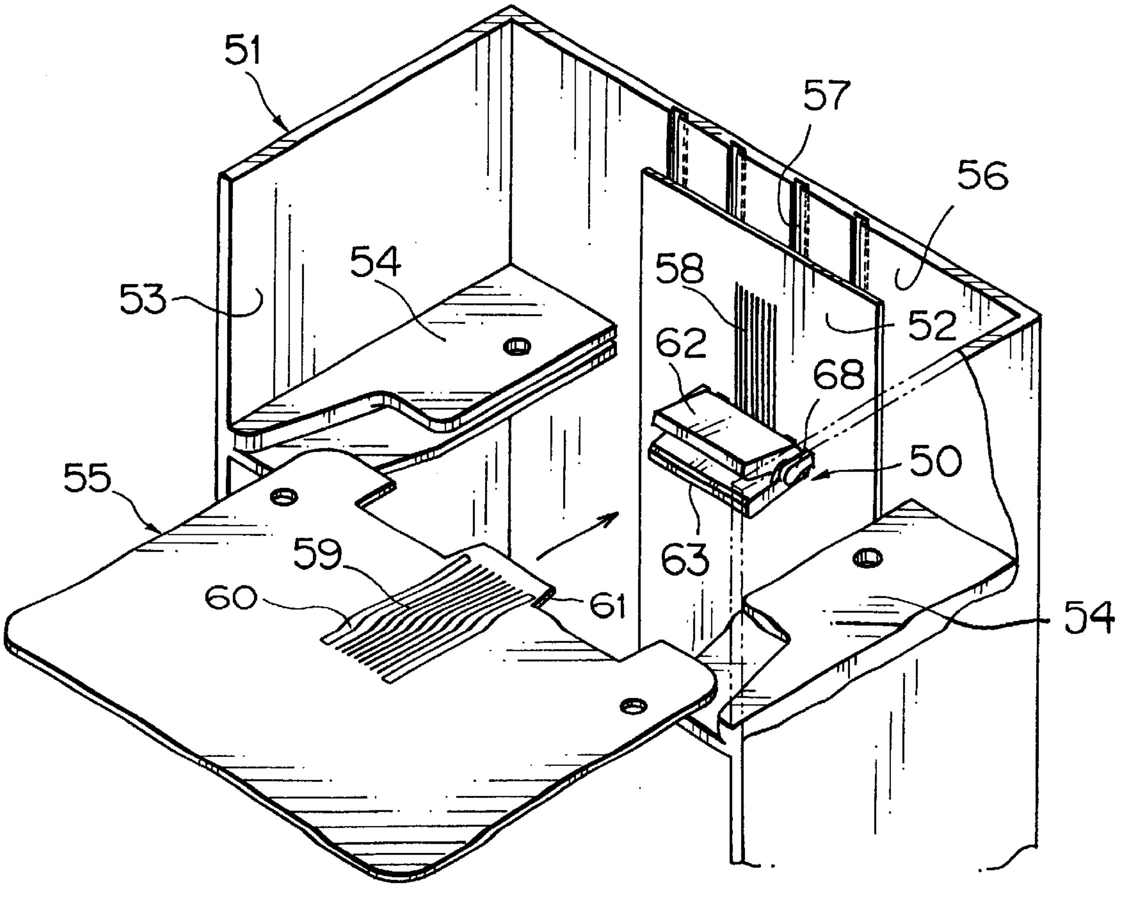
FIG. 6 is a perspective view showing a second embodiment of a connector in accordance with the present invention and an application thereof.

FIGS. 6–9 show a second embodiment of a board connecting terminal and a connector using the terminal in accordance with the present invention. FIG. 6 is a perspective view of the connector 50. A vertical first (or second) circuit board 52 arranged inside a casing 51, which is an instrument panel core of a motor vehicle, a horizontal second (or first) circuit board 55, to be inserted into guide portions 54, and a vertical third circuit board 56, utilizing the rear wall of the casing 51 and having vertical power busbars 57, are connected by means of the connector 50.

A plurality of vertical circuit conductors (printed conductors) 58 of the first circuit board 52 are signal conductors. A plurality of circuit conductors (printed conductors) 59,60 on the face of the second circuit board 55 are signal and power conductors. The center and both sides of the second circuit board 55 project forward, and the distal ends of the circuit conductors 59,60 are arranged on the projecting portion 61 at the center. The other structure, other than the above, is similar to the embodiment of FIG. 1.

Figure 7:
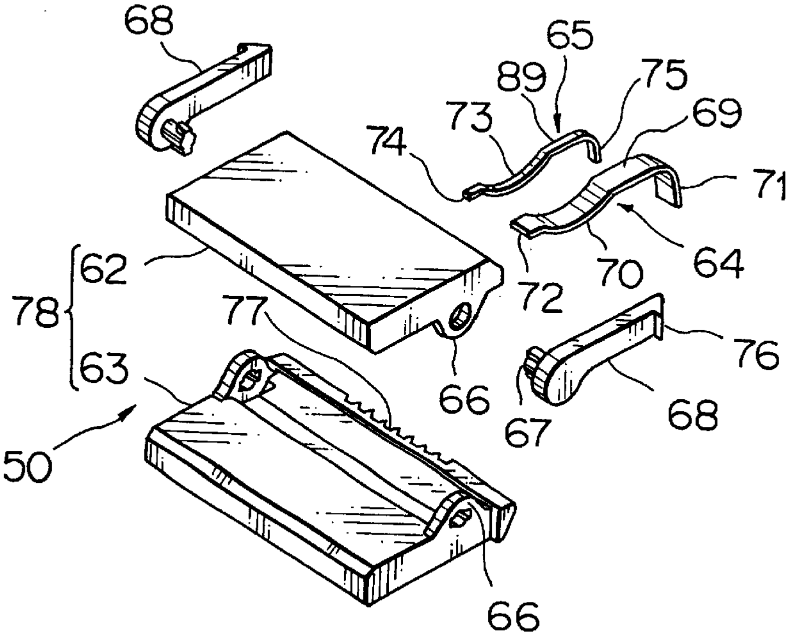
FIG. 7 is an exploded perspective view showing the connector.

FIG. 7 is an exploded perspective view showing the connector 50. The connector 50 has upper and lower housings 62,63 made of synthetic resin, wide power and narrow signal terminals (board connecting terminals) 64,65 are arranged on the upper housing 62, and engaging arms 68 are turnable about respective shaft portions 67 of hinge portions 66 of the housings 62,63. Different from the connector 22 of FIG. 2, the connector 50 has the signal terminals 65 (only one is shown) and the power terminals 64 (only one is shown), and the terminals 64,65 face downward.

The power terminal 64 is easily formed of a piece of conductive metal plate. The power terminal 64 has an elastic contact portion (a first elastic contact portion) 70 projecting downward in a circular-arc at the rear of a middle baseplate portion 69 and also has an elastic contact portion (a second elastic contact portion) 71 bent downward at the front of the middle baseplate portion 69. The terminal 26 of FIG. 3 differs in the middle baseplate portion 36 as it is curving slightly. A short straight portion (an end portion) 72 continues from the elastic contact portion 70. The elastic contact portion 71 is put into contact with the busbar 57 of the third circuit board 56 of FIG. 6, and the elastic contact portion 70 is put into contact with the circuit conductor 60 of the second circuit board 55.

The signal terminal 65 has a shape similar to the power terminal 64 as shown in FIG. 7. Specifically, its middle baseplate portion 89 is shorter than that of the middle baseplate portion 69 of the power terminal 64. The signal terminal 65 is formed of a piece of conductive metal plate.

The signal terminal 65 has an elastic contact portion (a first elastic contact portion) 73, a straight portion (an end portion) 74, a middle baseplate portion 89, and an elastic contact portion (a second elastic contact portion) 75.

Figure 8:
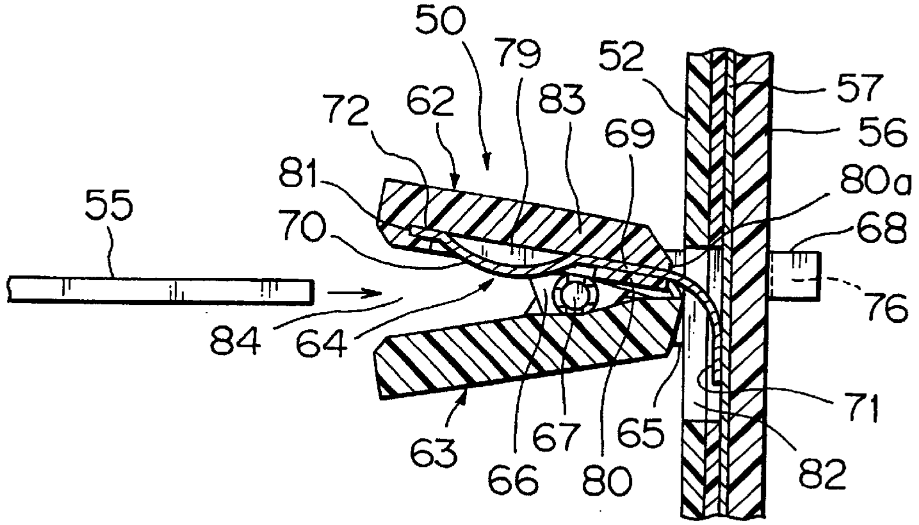
FIG. 8 is a longitudinal sectional view showing a state of the connector engaging a vertical circuit board.

In FIG. 7, the character 76 designates an engaging claw, and 77 designates a terminal positioning groove. Referring to FIG. 8, the upper housing 62 has terminal accommodating grooves 79 in parallel. The upper housing 62 has supporting walls (a supporting portion) 80 to hold the middle baseplate portions 69,89 of the terminals 64,65 at the front end thereof, and groove portions 81 to hold the straight portions 72,74 of the terminals 64,65 at the rear end thereof. The supporting wall 80 is provided for each terminal accommodating groove 79. A wide terminal accommodating groove 79 for the power terminal 64 is formed on both sides of the housing 62, and narrow terminal accommodating grooves (not shown) 79 for the respective signal terminals 65 are arranged inside thereof.

Also referring to FIG. 8, when the housings 62,63 are in an opened state, the elastic contact portions 71 of the power terminals 64 project forward more than the signal terminals 65 and are put into slight contact with the busbars 57 of the third circuit board 56. The elastic contact portions 75 (FIG. 7) of the signal terminals 65 are put into slight contact with the circuit conductors 58 of the first circuit board 52 (FIG. 6). The engaging arms 68 are put through both of the vertical circuit boards 52,56, and the engaging claws 76 engage the back of the third circuit board 56.

In FIG. 8, the elastic contact portions 70 of the power terminals 64 project downward from the upper housing 62, and the rear straight portions 72 engage the grooves 81 of the housing 62. The middle baseplate portion 69 is slidably supported in an opening portion **80*a* (or a rectangular hole or slot) between the supporting wall 80 and the base plate portion 83 of the housing 62. The middle baseplate portion 69 can smoothly shift in the opening portion 80*a* since an inside dimension of the opening portion 80*a* is slightly larger than an outside dimension of the terminal 64. Hole portions 82 to receive the respective elastic contact portions 71 of the power terminals 64 are provided on the first circuit board 52**.

The signal terminals 65 are slidably supported in the opening portion **80*a* between the supporting walls 80 and the base plate portion 83 of the housing 62 in almost the same state as the power terminals 64. An inside dimension of the opening portion 80*a* is slightly larger than an outside dimension of the terminal 65**.

The terminals 64,65 are attached to the upper housing 62 from their rear end through respective hole portions **80*a* between the supporting walls 80 and the base plate portion 83 of the upper housing 62. The straight portions 72,74 are inserted in the groove portions 81. Otherwise, the front elastic contact portions 71,75 are inserted into the opening portion 80*a* from the terminal accommodating groove 79 side projecting forward. The front elastic contact portions 71,75 are curved or inclined, and subsequently the straight portions 72,74 are inserted or pressed in the groove portion 81**.

The upper and lower housings 62,63 are turnable in relation to each other about the hinges, i.e. the shaft portions 67 and the bearings 66. The second circuit board 55 is inserted into the rear opening 84 between the housings 62,63. The second circuit board 55 is connected to an accessory such as an electrical appliance.

Figure 9:
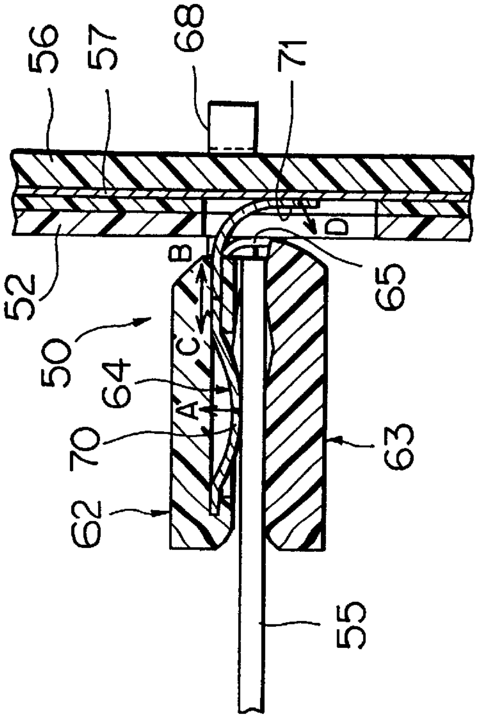
FIG. 9 is a longitudinal sectional view showing a state that a horizontal circuit board is connected to the vertical circuit board through the connector.

As shown in FIG. 9, when the second circuit board 55 is inserted, upper and lower comers of the front end thereof abut sloping portions (not shown) provided at the respective inside front ends of the housings 62,63 so as to close the housings 62,63. The rear elastic contact portions 70,73 of the terminals 64,65 are put into contact with the circuit conductors 59 of the second circuit board 55 elastically, and simultaneously the elastic contact portions of the front elastic contact portions 71,75 are put into contact with the busbars 57 of the third circuit board 56 with the circuit conductors 58 of the first circuit board 52 in an elastically and sufficiently strong manner. When the housings 62,63 close, the terminals 64,65 turn along with the upper housing 62, and the front elastic contact portions 71,75 are pushed out forward.

The rear elastic contact portions 70,73 of the terminals 64,65 are bent upward in an arrow A direction by the second circuit board 55 and the middle baseplate portions 69,89 of the terminals 64,65 slide forward as shown by an arrow B. The front elastic contact portions 71,75 are thrust on the respective circuit conductors 57,58 of the third and first circuit boards 56,52.

The front elastic contact portions 71,75 receive reaction forces in an arrow D direction from the third and first circuit boards 56,52, the middle baseplate portions 69,89 slide backward in an arrow C direction, and the rear elastic contact portions 70,73 are further bent downward and thrust on the circuit conductors 59,60 of the second circuit boards 55.

Like the above, the elastic contact portions 70,71,73,75 are securely put into contact with the respective circuit boards 52,55,56 with the same contact pressure of the electrical connection between the terminals 64,65, and the circuit connection of boards 52,55,56 is improved.

For example, even if the contact pressure between the front elastic contact portions 71,75 and the third and first circuit boards 56,52 is too weak because of the connector 50 lying too much on the rear side, the front elastic contact portions 71,75 are put into contact with the third and first circuit boards 56,52 with sufficient contact pressures since the front elastic contact portions 71,75 are pushed forward by the rear elastic contact portions 70,73 being pressed upward by the second circuit board 55.

On the contrary, even if the terminal accommodating groove 79 of the housing 62 is too deep or an excrescence quantity of the rear elastic contact portion 70,73 is too small, the rear elastic contact portions 70,73 are bent downward and put into contact with the second circuit board 55 with sufficient contact pressures when the front elastic contact portions 71,75 are pressed by the third and first circuit boards 56,52, and reliability of the electrical connection of the connector 50 is improved.

Figure 10:
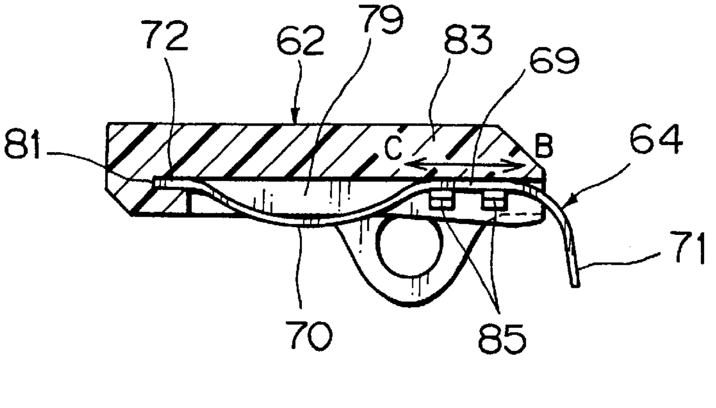
FIG. 10 is a longitudinal sectional view showing a main portion of a third embodiment of a connector in accordance with the present invention.

FIG. 10 is a longitudinal sectional view showing a main portion of a third embodiment of a connector in accordance with the present invention. In this embodiment, the terminal supporting wall 80 (FIG. 8) of the above connector 50 is replaced with two, right and left, pairs of supporting projections (i.e. supporting portions) 85 provided on the upper housing 62 for supporting and engaging the terminals. And, the terminals 64,65 (FIG. 11) each are supported between the supporting projections 85 and the bottom face of the terminal accommodating groove 79 of the housing 62 slidably in a longitudinal direction. Since the structure other than the supporting projection 85 is the same as that of the second embodiment, the same characters are applied to the corresponding elements or members.

As shown in FIG. 10, the terminal 64 is slidable in the arrows B,C (front and back) directions while the straight middle baseplate portion 69 thereof is supported by the supporting projections 85. The rear-end-side straight portion 72 of the terminal 64 is fixed by the groove portion 81. A gap between the base plate portion 83 and the supporting projection 85 is slightly larger than the thickness of the terminal 64. Since the middle baseplate portion 69 is supported stably by the two, front and back, pairs of supporting projections 85, the middle baseplate portion 69 can smoothly slide even when the rear elastic contact portion 70 is pressed on the second circuit board 55 (FIG. 8) and the front elastic contact portion 71 is pressed on the third circuit board 56 (FIG. 8).

Figure 11:
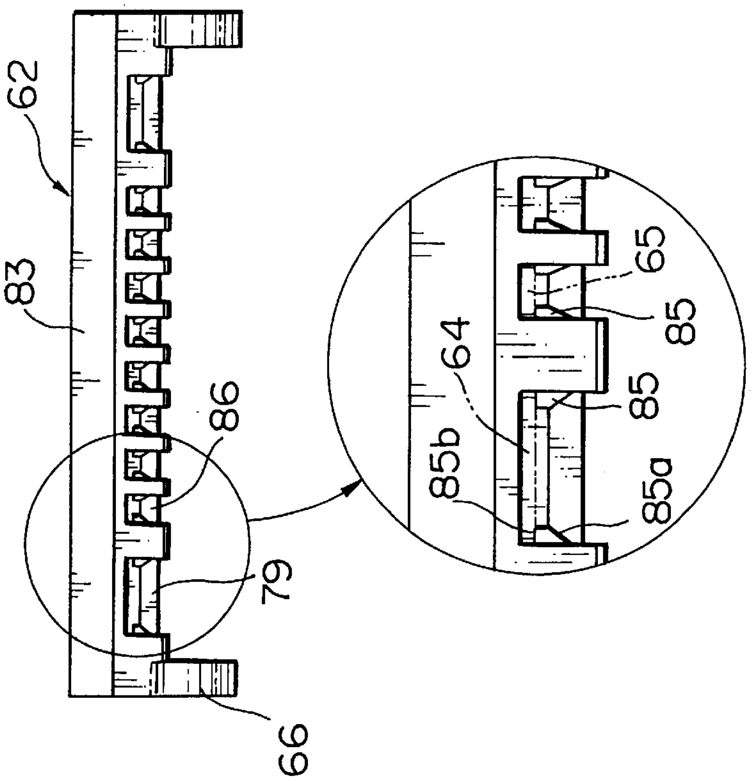
FIG. 11 is a front view of FIG. 10, showing an upper housing.
Figure 12:
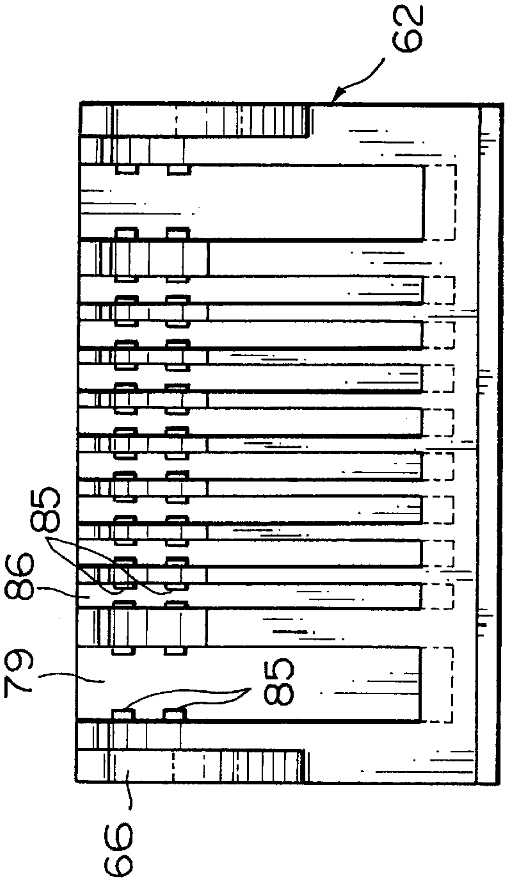
FIG. 12 is a plan view of the upper housing.

FIG. 11 is a front view of FIG. 10, showing the upper housing 62, and FIG. 12 is a plan view of the upper housing 62. A wide terminal accommodating groove 79 is arranged on each side of the upper housing 62, and narrow terminal accommodating grooves 86 are arranged between the grooves 79. Two pairs of supporting projections 85 are arranged in each terminal accommodating groove 79,86.

Each supporting projection 85 has an upward supporting plane (engaging plane) **85*b* and a downward slanting plane 85*a*. The middle baseplate portions 69,89 of the terminals 64,65 are inserted upward along the slanting planes 85*a*; the terminals 64,65 are easily attached to the housing 62. The terminals 64,65 are supported by the supporting planes 85*b*. The supporting projections 85 can be bent inwardly so that the insertion of the terminals 64,65 is permitted or the terminal 64 may be bent when inserted. Character 66** designates a bearing forming a hinge.

FIGS. 13–17 show a fourth embodiment of a board connecting terminal and a connector using the terminal in accordance with the present invention. A connector 90 consist of a male connector housing 91, an L-shaped terminal (the board connecting terminal) 92 slidably accommodated in the connector housing 91, and a power terminal 93.

Figure 13:
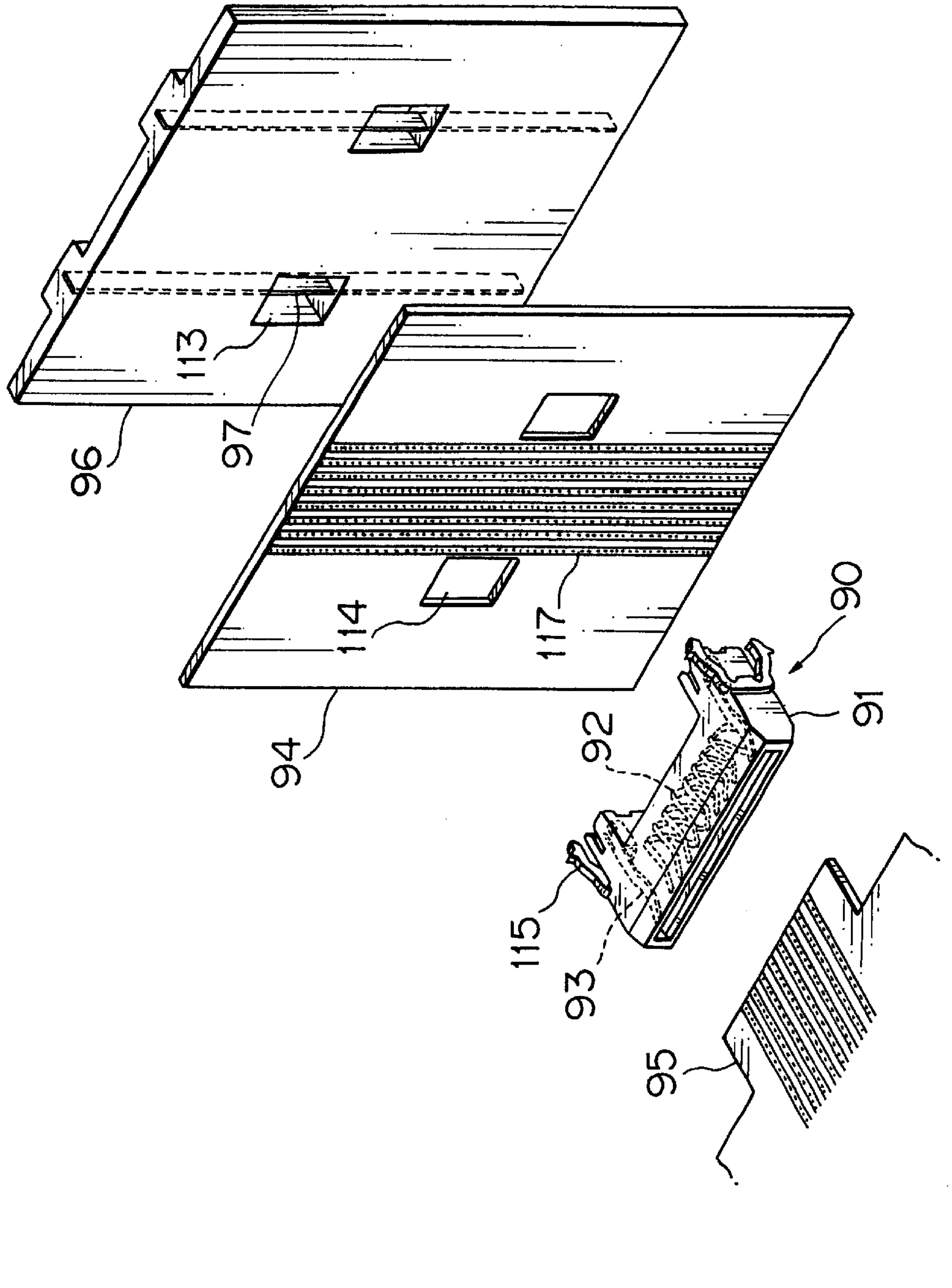
FIG. 13 is an exploded perspective view showing a fourth embodiment of a terminal and a connector using the terminal in accordance with the present invention and an application thereof.

In FIG. 13, character 94 designates a vertical first circuit board, 95 is a printed circuit board, for the accessories, as a second circuit board which is horizontally inserted into the connector 90 from the back, and 96 is a vertical third circuit board, as an instrument panel core including a busbar 97, to be arranged on the back of the first circuit board 94.

Figure 14:
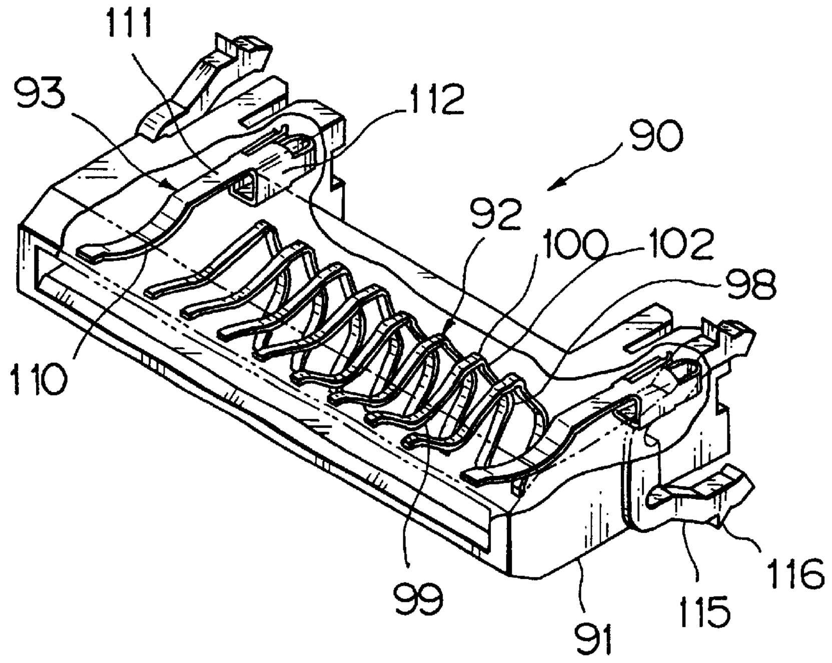
FIG. 14 is a perspective view showing the connector.

Referring to FIG. 14, the connector 90 accommodates a plurality of signal terminals 92 in parallel inside the generally rectangular connector housing 91 made of insulative resin, and a pair of power terminals 93 arranged on the respective sides of the connector housing 91.

Figure 16:
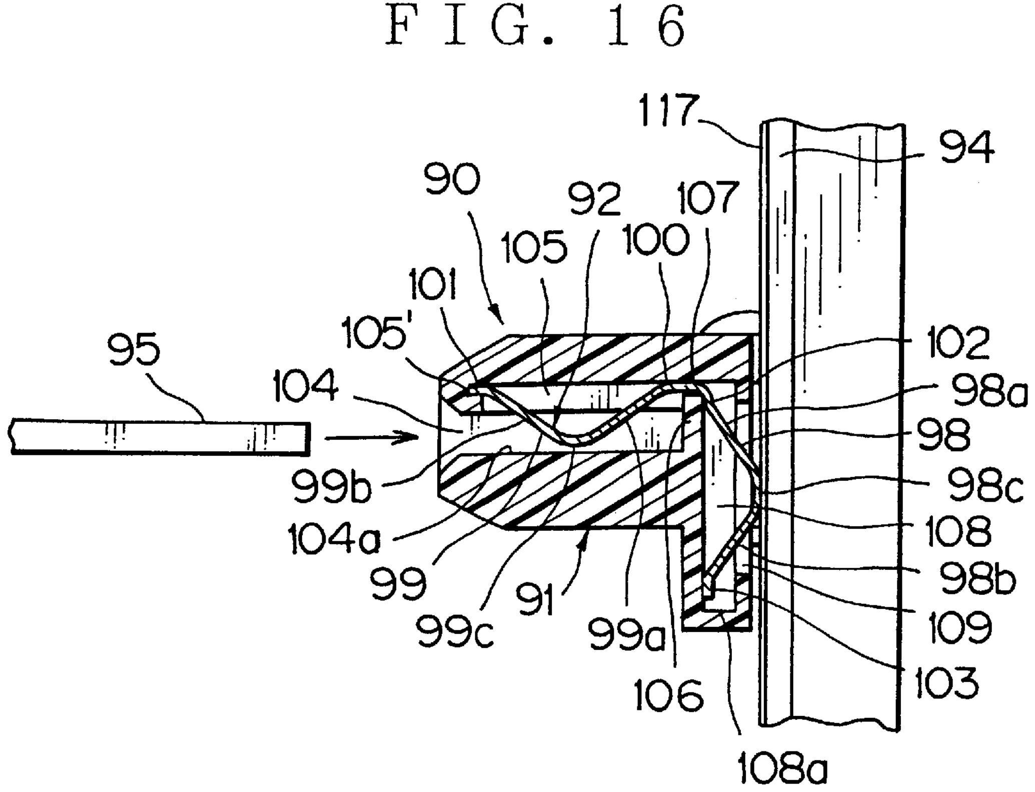
FIG. 16 is a longitudinal sectional view of FIG. 15.

The signal terminal 92, as shown in FIG. 16, has a front elastic contact portion (the second elastic contact portion) 98 mountain-shapedly forwardly and projecting against the first circuit board 94 and a rear elastic contact portion (the first elastic contact portion) 99 mountain-shapedly downwardly and projecting against the second circuit board 95. A middle baseplate portion 100 connecting both the elastic contact portions 98,99 is supported by the connector housing 91. Both the elastic contact portions 98,99 are of substantially similar shape and arranged at right angles with each other. Spring constants of the elastic contact portions 98,99 are substantially the same.

The rear elastic contact portion 98 for the second circuit board 95 consists of a forward and backward pair of slanting pieces **99*a*,99*b* and a curved contact portion 99*c* connecting both the slanting pieces 99*a*,99*b* smoothly. The rear slanting piece 99*b* continues from a rear-end-side short horizontal straight portion 101, which is inserted and fixed in a groove portion 105' of the connector housing 91. The front slanting piece 99*a* continues from a horizontal straight middle baseplate portion 100. The middle baseplate portion 100 continues to a stopping portion 102 bent orthogonally to the middle baseplate portion 100, which stopping portion 102 continues to an upper slanting piece 98*a* of the front elastic contact portion 98 for the first circuit board 95. The upper slanting piece 98*a* continues to a lower slanting plane 98*b* through a curved contact 98*c*. The lower slanting piece 98*b* continues to a short straight portion (the free end) 103** being a lower free end.

A horizontal board insertion hole 104 for the second circuit board 95 is provided on the connector housing 91, and the rear elastic contact portion 99 projects in the board insertion hole 104. The rear and front end portions of the rear elastic contact portion 99 and the middle baseplate portion 100 are positioned in the terminal accommodating groove 105 of the connector housing 91. Between the bottom face of the accommodating groove 105 and the top end of a vertical supporting wall (the supporting portion) 106, serving as a termination wall of the terminal accommodating groove 105, a gap, i.e. an opening portion 107, having a thickness a little larger than the thickness of the terminal 92 is formed, and the middle baseplate portion 100 is supported in the opening portion slidably. The length of the middle baseplate portion 100 is longer than the thickness of the supporting wall 106.

The horizontal terminal accommodating groove 105 continues to a vertical terminal accommodating groove 108 through the opening portion 107. Upper and lower end portions of the front elastic contact portion 98 are arranged in the vertical terminal accommodating groove 108. The vertical terminal accommodating groove 108 continues to a front opening 109 facing the first circuit board 94. A contact **98*c* of the front elastic contact portion 98 projects from the front opening 109. There is a small gap between the end of the straight portion 103 and a bottom end 108***a* of the terminal accommodating groove 108 so that the straight portion 103 can slide on the bottom face of the accommodating groove 108. The connector housing 91 has an L-shaped longitudinal section.

As shown in FIG. 14, both of the power terminals 93 have an arcuated elastic contact portion 110 for the second circuit board 95, a middle baseplate portion 111 continuing from the elastic contact portion 110, and a female electrically contacting portion 112 continuing from the middle baseplate portion 111. The electrically contacting portion 112 has a U-shaped elastically contacting piece which holds a vertical busbar 97 in the opening portion 113 of the third circuit board 96 (FIG. 13). The first circuit board 94 is provided with opening portions 114 (the engaging means). An engaging arm of the housing 91 and the power terminal 93 are put through each opening portion 114.

An upper and lower pair of resilient engaging arms 115 project from each side of the connector housing 91. The engaging arm 115 has a claw portion 116 for engagement. The pair of engaging arms 115 are put through the opening portions 114,113 of the first and third circuit boards 94,96 so as to fix the connector 90 as shown in FIG. 15.

The front elastic contact portion 98 is put slightly into contact with the circuit conductor 117 of the first circuit board 94 in an engaging state of the connector 90 as shown in FIG. 16. The rear elastic contact portion 99 largely projects in the board insertion hole 104, and the contact 99*c* approaches a lower insertion hole internal surface 104*a*. The middle baseplate portion 100 is slidably supported by the supporting wall 106 longitudinally, and the stopping portion 102 abuts the front end surface of the supporting wall 106. In this state, the middle baseplate portion 100 extends behind the supporting wall 106 straightly by a length almost equal to the thickness of the supporting wall 106.

As shown in FIG. 16, when the front elastic contact portion 98 is initially put into contact with the first circuit board 94, the initial state of the rear elastic contact portion 99 is maintained by the stopping portion 102, and an insertion gap for the second circuit board 95 is secured under the elastic contact portion 99, whereby insertion force of the second circuit board 95 is small. Because the second circuit board 95 is smoothly inserted, wear or deformation of the rear elastic contact portion 99 and wear and damage of the circuit conductor of the second circuit board 95 can be prevented.

Figure 15:
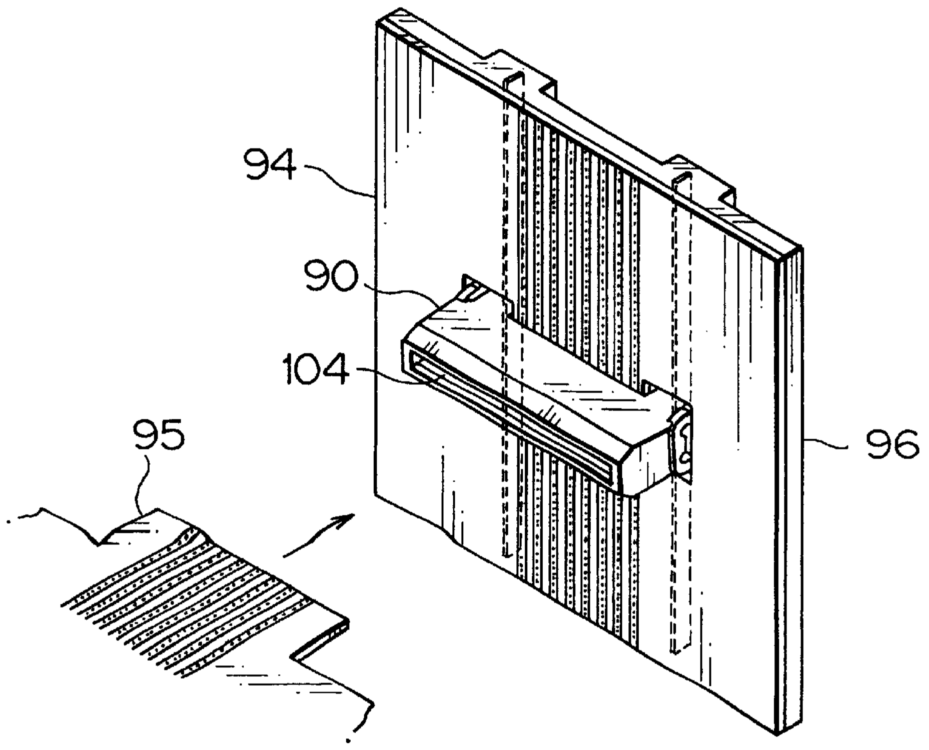
FIG. 15 is a perspective view showing a state of the connector engaging a vertical circuit board.
Figure 17:
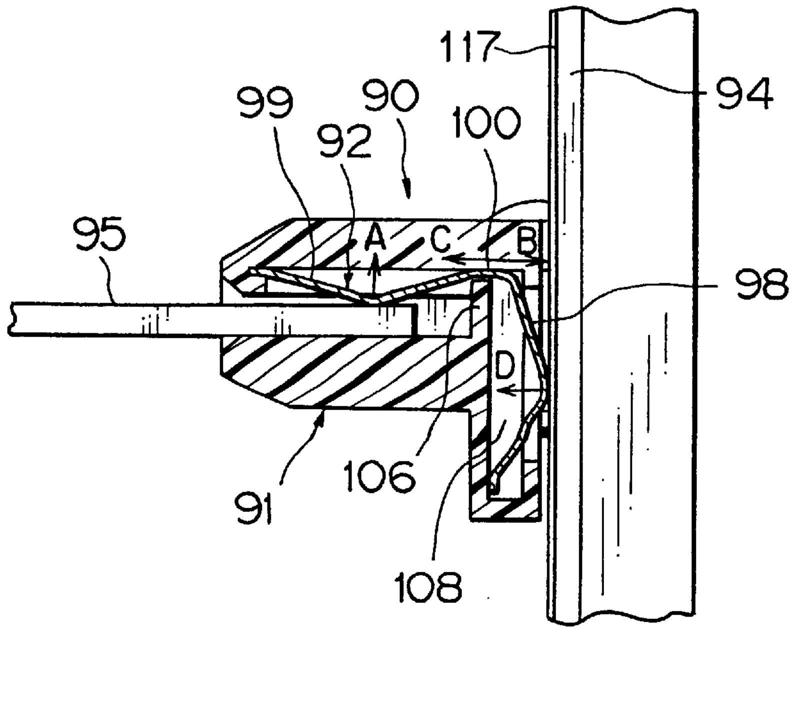
FIG. 17 is a longitudinal sectional view showing a state that a horizontal circuit board is connected to the vertical circuit board through the connector.

The distal end portion of the second circuit board 95 is inserted in the insertion hole 104 of the connector 90 as shown by the arrows in FIGS. 15, 16. As shown in FIG. 17, the rear elastic contact portion 99 is put into contact with the second circuit board 95 while being pressed upward in the arrow A direction, the middle baseplate portion 100 slides forward on the supporting wall 106 in the opening portion 107, and the front elastic contact portion 98 is thrust toward the first circuit board 94. As described, the front elastic contact portion 98 is securely put into contact with the first circuit board 94 with a strong contact pressure.

The front elastic contact portion 98 receives a reaction force from the first circuit board 94 in the arrow D direction. By this, the middle baseplate portion 100 slides backward as shown by the arrow C, and the rear elastic contact portion 99 is compressed and securely put into contact with the second circuit board 95 with a strong contact pressure.

As described, the contact pressures of the front and rear elastic contact portions 98,99 balance, and the elastic contact portions 98,99 are put into contact with the circuit boards 94,95 securely. Therefore, reliability of the electrical connection between the circuit boards 94,95 and the connector 90 is improved.

In the embodiment of FIG. 17, especially because the free end (the bottom end) of the front elastic contact portion 98 is supported by the bottom face of the terminal accommodating groove 108 of the connector housing 91, the middle baseplate portion 100 of the terminal 92 slides backward securely and smoothly when the front elastic contact portion 98 is pressed backward by the first circuit board 94, whereby an adjustment of the contact pressure of the rear elastic contact portion 99 is carried out securely and smoothly.

Although the elastic contact portions 98,99 in a mountain-shape is used in the terminal of FIG. 16, an arcuated elastic contact portion may be used. In this case, the front and rear elastic contact portions 98,99 should be in the same shape so as to balance the contact pressures. And, the front elastic contact portion 98 of the terminal 92 of FIG. 16 may arcuately or inclinedly project like the front elastic contact portion 35 of the terminal 26 of FIG. 4. At the same time, the free end side of the front elastic contact portion may be bent slidably on the bottom wall of the terminal accommodating groove 108 of the connector housing 91.

The power terminal 93 of the connector 90 of FIG. 14 may be replaced with a terminal similar to, but a-size-larger and longer than, the signal terminal 92 of FIG. 14 which is similar to the power terminal 64 of the connector 50 of FIG. 7, and a power busbar similar to the busbar 57 of FIG. 8 may be used. For example, two terminals 26 of FIG. 2 may be connected as a joint-terminal.

Although the present invention has been fully described by way of examples with reference to the accompanying drawings, it is to be noted that various changes and modifications will be apparent to those skilled in the art. Therefore, unless otherwise such changes and modifications depart from the scope of the present invention, they should be construed as being included therein.

What is claimed is:

1. A connector, using a board connecting terminal having a first elastic contact portion projecting arcuately or mountain-shapedly, a second elastic contact portion curvingly inclinedly extending in substantially the same direction as the projecting direction of the first elastic contact portion and a middle baseplate portion being curved or straight and connected to the first elastic contact portion and the second elastic contact portion, said connector placing the first elastic contact portion into contact with a first circuit board and the second elastic contact portion into contact with a second circuit board, the connector comprising:

a connector housing accommodating at least the first elastic contact portion of the board connecting terminal; and a supporting portion provided on the connector housing so as to slidably support the middle baseplate portion, wherein a free end of the first elastic contact portion abuts, or is fixed to, the connector housing, and the board connecting terminal is longitudinally slidably supported by the supporting portion.

2. The connector as set forth in claim 1, wherein a stopping portion to abut the supporting portion is formed between the middle baseplate portion and the second elastic contact portion.

3. The connector as set forth in claim 1, wherein the connector housing consists of a pair of housings openable-and-closable through a hinge, and the first circuit board is inserted between the housings.

4. The connector as set forth in claim 3, wherein at least two kinds of board connecting terminals having different respective lengths are provided, and the board connecting terminal having a longer length is put into contact with a third circuit board arranged behind the second circuit board.

5. the connector as set forth in claim 1, wherein the connector housing has a board insertion hole in which the first elastic contact portion projects and an opening from which the second elastic contact portion projects.

6. The connector as set forth in claim 1, wherein the connector housing is provided with an engaging means to engage the second circuit board.

7. A connector using a board connecting terminal including a first elastic contact portion projecting arcuately or mountain-shapedly, a second elastic contact portion in substantially the same shape as the first elastic contact portion and which is formed axial-symmetrically with the first elastic contact portion, and a middle baseplate portion being curved or straight and connected to the first elastic contact portion and the second elastic contact portion, the connector placing the first elastic contact portion into contact with a first circuit board and the second elastic contact portion into contact with a second circuit board, the connector comprising:

a connector housing accommodating at least the first elastic contact portion of the board connecting terminal; and a supporting portion provided on the connector housing so as to slidably support the middle baseplate portion, wherein a free end of the first elastic contact portion abuts, or is fixed to, the connector housing, and the board connecting terminal is longitudinally slidably supported by the supporting portion, and wherein a free end of the second elastic contact portion is slidably supported by the connector housing.

8. A connector using a board connecting terminal, comprising a first elastic contact portion projecting arcuately or mountain-shapedly;

a second elastic contact portion curvingly inclinedly extending in substantially the same direction as the projecting direction of the first elastic contact portion; and a middle baseplate portion being curved or straight and connecting the first elastic contact portion and the second elastic contact portion; to dispose the first elastic contact portion into contact with a first circuit board and dispose the second elastic contact portion into contact with a second circuit board, said connector comprising:

a connector housing accommodating at least the first elastic contact portion of the board connecting terminal; and a supporting portion provided on the connector housing so as to slidably support the middle baseplate portion, wherein a free end of the first elastic contact portion abuts, or is fixed to, the connector housing, and the board connecting terminal is longitudinally slidably supported by the supporting portion, and at least two kinds of board connecting terminals having different respective lengths are provided, and the board connecting terminal having a longer length is put into contact with a third circuit board arranged behind the second circuit board.

9. A connector using a board connecting terminal, as set forth in claim 8, wherein a short straight portion is formed at the free end of the first elastic contact portion.

10. A connector using a board connecting terminal, as set forth in claim 8, wherein in place of the second elastic contact portion, another second elastic contact portion in substantially the same shape as the first elastic contact portion is formed axial-symmetrically with the first elastic contact portion.

11. A connector, using a board connecting terminal, comprising a first elastic contact portion projecting arcuately or mountain-shapedly, a second elastic contact portion curvingly inclinedly extending in substantially the same direction as the projecting direction of the first elastic contact portion and which is formed axial-symmetrically with the first elastic contact portion, and a middle baseplate portion being curved or straight and connecting the first elastic contact portion and the second elastic contact portion, the connector placing the first elastic contact portion into contact with a first circuit board and the second elastic contact portion into contact with a second circuit board, the connector comprising:

a connector housing accommodating at least the first elastic contact portion of the board connecting terminal; and a supporting portion provided on the connector housing so as to slidably support the middle baseplate portion, wherein a free end of the first elastic contact portion abuts, or is fixed to, the connector housing, and the board connecting terminal is longitudinally slidably supported by the supporting portion, a free end of the second elastic contact portion is slidably supported by the connector housing, and at least two kinds of board connecting terminals having different respective lengths are provided, and the board connecting terminal having a longer length is put into contact with a third circuit board arranged behind the second circuit board.

12. A connector, using a board connecting terminal, comprising a first elastic contact portion projecting arcuately or mountain-shapedly, a second elastic contact portion curvingly inclinedly extending in substantially the same direction as the projecting direction of the first elastic contact portion; and a middle baseplate portion being curved or straight and connecting the first elastic contact portion and the second elastic contact portion, to dispose the first elastic contact portion into contact with a first circuit board and dispose the second elastic contact portion into contact with a second circuit board, said connector comprising:

a connector housing accommodating at least the first elastic contact portion of the board connecting terminal; and a supporting portion provided on the connector housing so as to slidably support the middle baseplate portion, wherein a free end of the first elastic contact portion abuts, or is fixed to, the connector housing, and the board connecting terminal is longitudinally slidably supported by the supporting portion, a stopping portion to abut the supporting portion is formed between the middle baseplate portion and the second elastic contact portion, and at least two kinds of board connecting terminals having different respective lengths are provided, and the board connecting terminal having a longer length is put into contact with a third circuit board arranged behind the second circuit board.

13. A connector using a board connecting terminal, as set forth in claim 12, wherein a short straight portion is formed at the free end of the first elastic contact portion.

14. A connector using a board connecting terminal, as set forth in claim 12, wherein in place of the second elastic contact portion, another second elastic contact portion in substantially the same shape as the first elastic contact portion is formed axial-symmetrically with the first elastic contact portion.

15. A connector, using a board connecting terminal, comprising a first elastic contact portion projecting arcuately or mountain-shapedly;

a second elastic contact portion curvingly inclinedly extending in substantially the same direction as the projecting direction of the first elastic contact portion; and a middle baseplate portion being curved or straight and connecting the first elastic contact portion and the second elastic contact portion, to dispose the first elastic contact portion into contact with a first circuit board and dispose the second elastic contact portion into contact with a second circuit board, comprising:

a connector housing accommodating at least the first elastic contact portion of the board connecting terminal; and a supporting portion provided on the connector housing so as to slidably support the middle baseplate portion, wherein a free end of the first elastic contact portion abuts, or is fixed to, the connector housing, and the board connecting terminal is longitudinally slidably supported by the supporting portion, the connector housing has a board insertion hole in which the first elastic contact portion projects and an opening from which the second elastic contact portion projects, and at least two kinds of board connecting terminals having different respective lengths are provided, and the board connecting terminal having a longer length is put into contact with a third circuit board arranged behind the second circuit board.

16. A connector using a board connecting terminal, as set forth in claim 15, wherein a short straight portion is formed at the free end of the first elastic contact portion.

17. A connector using a board connecting terminal, as set forth in claim 15, wherein in place of the second elastic contact portion, another second elastic contact portion in substantially the same shape as the first elastic contact portion is formed axial-symmetrically with the first elastic contact portion.

18. A connector, using a board connecting terminal, comprising a first elastic contact portion projecting arcuately or mountain-shapedly;

a second elastic contact portion curvingly inclinedly extending in substantially the same direction as the projecting direction of the first elastic contact portion; and a middle baseplate portion being curved or straight and connecting the first elastic contact portion and the second elastic contact portion, to dispose the first elastic contact portion into contact with a first circuit board and dispose the second elastic contact portion into contact with a second circuit board, comprising:

a connector housing accommodating at least the first elastic contact portion of the board connecting terminal; and a supporting portion provided on the connector housing so as to slidably support the middle baseplate portion, wherein a free end of the first elastic contact portion abuts, or is fixed to, the connector housing, and the board connecting terminal is longitudinally slidably supported by the supporting portion, the connector housing is provided with an engaging means to engage the second circuit board, and at least two kinds of board connecting terminals having different respective lengths are provided, and the board connecting terminal having a longer length is put into contact with a third circuit board arranged behind the second circuit board.

19. A connector using a board connecting terminal, as set forth in claim 18, wherein a short straight portion is formed at the free end of the first elastic contact portion.

20. A connector using a board connecting terminal, as set forth in claim 18, wherein in place of the second elastic contact portion, another second elastic contact portion in substantially the same shape as the first elastic contact portion is formed axial-symmetrically with the first elastic contact portion.

* * * * *